United States Patent
Craford et al.

(10) Patent No.: US 7,791,096 B2
(45) Date of Patent: Sep. 7, 2010

(54) MOUNT FOR A SEMICONDUCTOR LIGHT EMITTING DEVICE

(75) Inventors: M. George Craford, Los Altos Hills, CA (US); Michael R. Krames, Los Altos, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 393 days.

(21) Appl. No.: 11/760,521

(22) Filed: Jun. 8, 2007

(65) Prior Publication Data
US 2008/0303039 A1    Dec. 11, 2008

(51) Int. Cl.
*H01L 33/00*    (2010.01)

(52) U.S. Cl. ............ 257/99; 257/678; 257/88; 257/89; 257/98; 257/E51.022; 257/E33.06; 257/E33.061; 257/E33.066; 438/26; 438/29; 438/35

(58) Field of Classification Search .......... 257/98, 257/99, 66, 89, E51.022, E33.06, E33.061, 257/E33.066
See application file for complete search history.

(56) References Cited

U.S. PATENT DOCUMENTS

| | | | |
|---|---|---|---|
| 6,184,544 B1 * | 2/2001 | Toda et al. | 257/98 |
| 6,964,877 B2 * | 11/2005 | Chen et al. | 438/20 |
| 7,518,158 B2 * | 4/2009 | Keller et al. | 257/98 |
| 2004/0195581 A1 | 10/2004 | Isoda | |
| 2007/0035969 A1 | 2/2007 | Kaneko et al. | |
| 2010/0075108 A1 | 3/2010 | Verschuuren | |
| 2010/0083844 A1 | 4/2010 | Budweg | |

FOREIGN PATENT DOCUMENTS

| | | |
|---|---|---|
| JP | 11307820 | 11/1999 |
| WO | 2006043234 A1 | 4/2006 |

OTHER PUBLICATIONS

International Search Report & Written Oppinion PCTIB2008/052244.

* cited by examiner

*Primary Examiner*—Jasmine J Clark

(57) ABSTRACT

A mount for a semiconductor device includes a carrier, at least two metal leads disposed on a bottom surface of the carrier, and a cavity extending through a thickness of the carrier to expose a portion of the top surfaces of the metal leads. A semiconductor light emitting device is positioned in the cavity and is electrically and physically connected to the metal leads. The carrier may be, for example, silicon, and the leads may be multilayer structures, for example a thin gold layer connected to a thick copper layer.

27 Claims, 5 Drawing Sheets

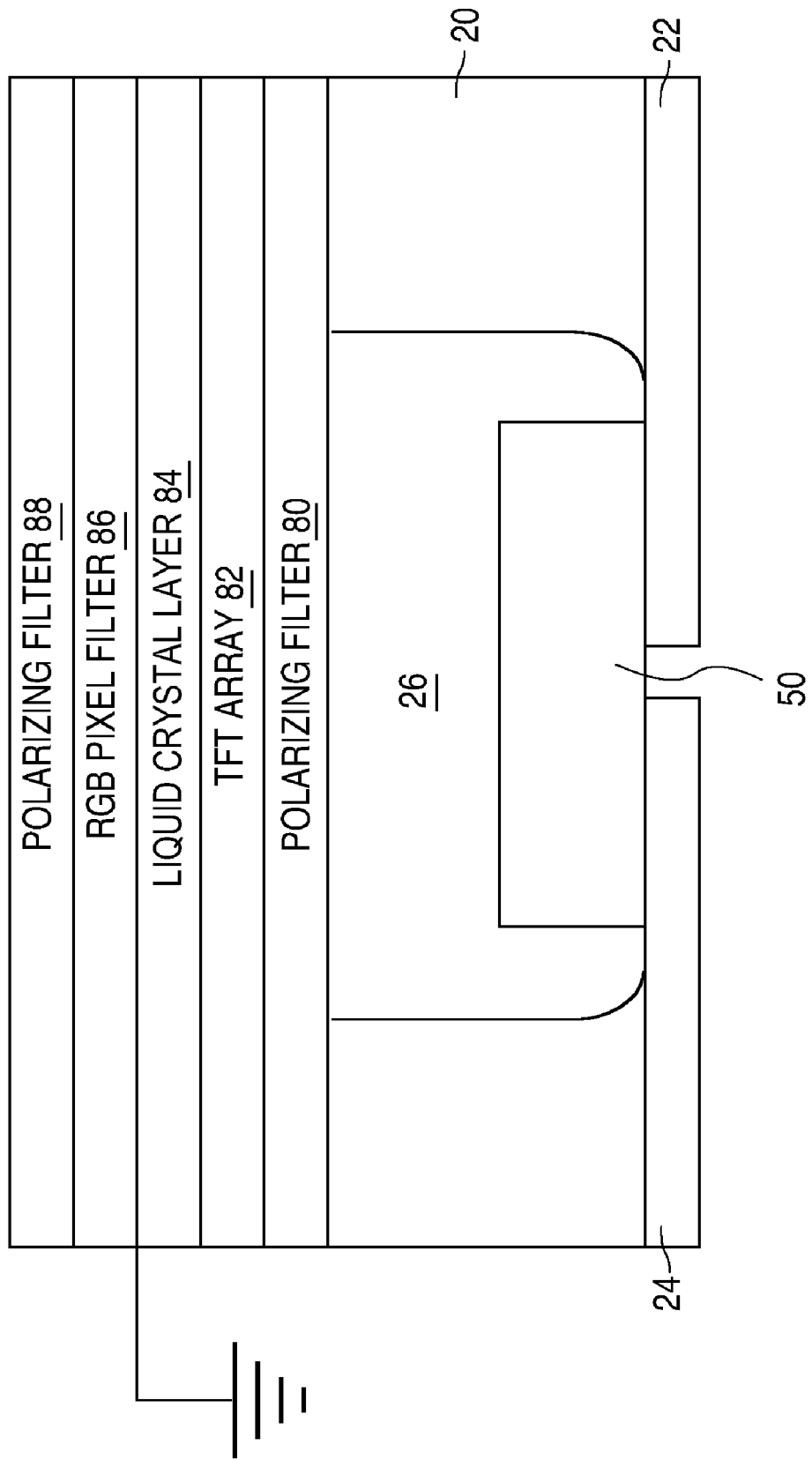

MOUNT FOR A SEMICONDUCTOR LIGHT EMITTING DEVICE

BACKGROUND

1. Field of Invention

The present invention is directed to a mount for a semiconductor light emitting device such as a light emitting diode.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD), molecular beam epitaxy (MBE), or other epitaxial techniques. Often, an n-type region is deposited on the substrate, then an active region is deposited on the n-type region, then a p-type region is deposited on the active region. The order of the layers may be reversed such that the p-type region is adjacent to the substrate.

Such devices are often mounted on mounts which provide electrical and mechanical connection between the semiconductor device and the larger system in which the device is included. Such mounts are often silicon. Since the mount is the primary thermal path for heat removal from the semiconductor device, the mount may be designed for high thermal conductivity. As semiconductor light emitting devices are operated at higher power, silicon mounts become increasingly incapable of efficiently dissipating the heat generated in the device. Needed in the art are mounts which provide low thermal resistance in addition to being inexpensive, easy to handle, and easy to manufacture.

SUMMARY

In accordance with embodiments of the invention, a mount for a semiconductor device includes a carrier, at least two metal leads disposed on a bottom surface of the carrier, and a cavity extending through a thickness of the carrier to expose a portion of the top surfaces of the metal leads. A semiconductor light emitting device is positioned in the cavity and is electrically and physically connected to the metal leads. The carrier may be, for example, silicon, and the leads may be multilayer structures, for example a thin gold layer connected to a thick copper layer. Such an arrangement may efficiently conduct heat away from the semiconductor light emitting device, since the entire thermal path from the semiconductor structure through the leads is metal.

BRIEF DESCRIPTION OF THE DRAWINGS

FIG. 14 is a cross sectional view of a portion of a liquid crystal display.

DETAILED DESCRIPTION

Figure 1:
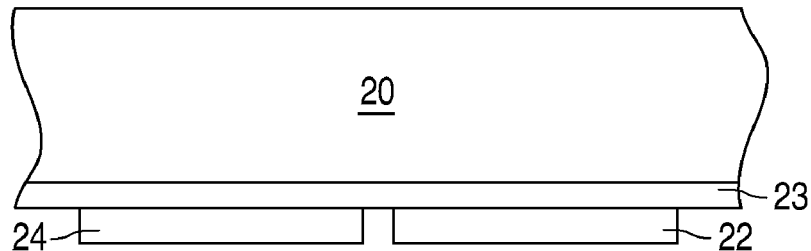
FIG. 1 is a cross sectional view of a portion of a carrier with metal contacts.

In the structure illustrated in FIG. 1, metal leads 22 and 24 are formed on one side of a carrier 20. The material of carrier 20 is selected for the strength to withstand required processing and bonding steps, for ease of handling during any processing steps such as machining, and for ease of patterning during patterning steps. Carrier 20 may be, for example, silicon, other semiconductors such as GaAs, GaP, or Ge, or a non-semiconductor such as plastic, alumina, ceramic, a fluoropolymer such as polytetrafluoroethylene (Teflon®), polycrystalline materials, or glass. In some embodiments, carrier 20 may be flexible. In some embodiments, wavelength converting or luminescent materials such as phosphor may be incorporated in carrier 20.

In some embodiments, leads 22 and 24 are electrically isolated from carrier 20 by a nonconductive layer 23, which may be, for example, an oxide of silicon. Nonconductive layer 23 may be formed on the bottom surface of carrier 20 prior to forming leads 22 and 24.

A layer of one or more metals is formed on one side of carrier 20, for example by plating. The metal layer is then patterned to form metal leads 22 and 24. The metal or metals used to form leads 22 and 24 may be selected to provide suitable electrical and mechanical connections to a semiconductor device such as a light emitting diode later mounted on leads 22 and 24. In some embodiments, the metal or metals used are selected for desired thermal conduction characteristics. For example, leads 22 and 24 may include a thick layer of copper separated from carrier 20 by a thin layer of gold. The thick copper layer provides heat conduction and the gold layer provides a desirable mechanical and electrical connection to a later-mounted device.

Figure 2:
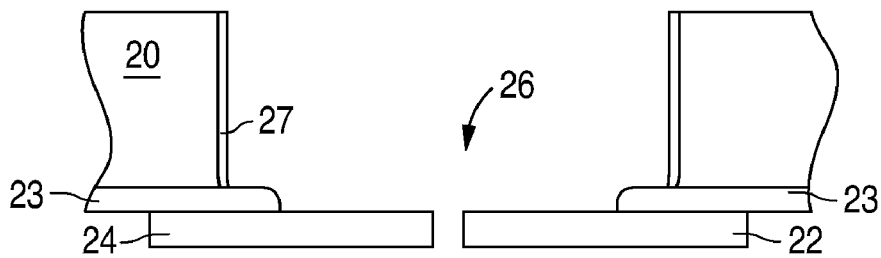
FIG. 2 is a cross sectional view of the structure of FIG. 1 after etching a cavity to reveal the tops of the metal contacts.

As illustrated in FIG. 2, a cavity 26 is formed in carrier 20. Cavity 26 may be formed by any suitable technique, such as etching, laser machining, or ablating. The entire thickness of carrier 20 is removed to expose the tops of leads 22 and 24. Though the sidewalls of the cavity shown in FIG. 2 are vertical, they may be angled or sloped. For example, the sidewalls may be sloped at an angle selected to reflect light out of the cavity in a particular pattern. A reflective coating 27 may be formed on the sidewalls of cavity 26. Any suitable reflective coating may be used, including for example a white diffuse reflective material such as E60L, available from Toray, or a reflective metal, such as a highly reflective aluminum mirror, available from Alanod. In some embodiments, nonconductive layer 23 is removed at the same time as cavity 26, resulting in the arrangement illustrated in FIG. 4. In some embodiments, nonconductive layer is patterned in a separate step, as in the arrangement illustrated in FIG. 2. In the device illustrated in FIG. 2, the opening in nonconductive layer 23 is smaller than the lateral extent of cavity 26.

Figure 3:
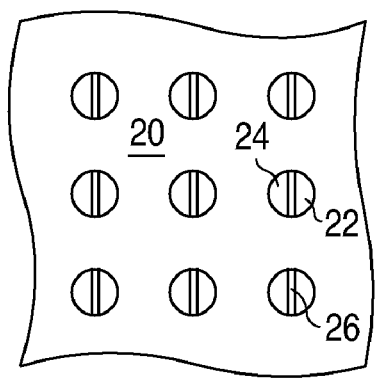
FIG. 3 is a plan view of a portion of a carrier with metal contacts and a plurality of cavities.

FIG. 3 is a top view of a portion of carrier 20. Multiple cavities 26, exposing sets of leads 22 and 24, may be formed in a carrier. One or more devices may be mounted in each of cavities 26. After processing, carrier 20 may be diced into individual cavities or arrays including multiple cavities.

Figure 4:
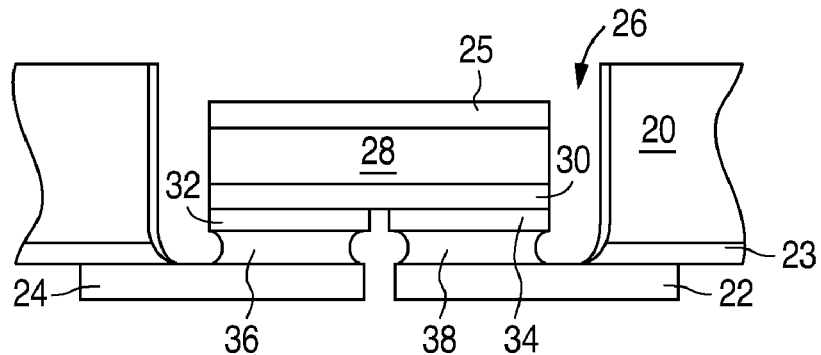
FIG. 4 is a cross sectional view of the structure of FIG. 2 after mounting a light emitting device in the cavity.

FIG. 4 is a cross sectional view of a semiconductor device mounted in cavity 26. Though the semiconductor device illustrated in FIG. 4 and described in the examples herein is a III-nitride flip chip semiconductor light emitting diode, it is to be understood that any suitable device may be used, including devices of other materials systems such as III-phosphide and III-arsenide devices. Also, though the device illustrated in FIG. 4 and described in the examples herein is configured such that light exits the device through the top, in some embodiments, a device configured such that light exits the device through the side may also be used. For example, in the device illustrated in FIG. 4, a reflector 25 may be disposed either over the top of substrate 28 as shown in FIG. 4, or over a portion of the opening of cavity 26, in order to redirect light out the sides of the device. Reflector 25 may be, for example, a white diffuse reflective coating such as E60L, available from Toray, or a reflective metal, such as a highly reflective aluminum mirror, available from Alanod.

The device illustrated in FIG. 4 includes semiconductor device layers 30 grown over a suitable growth substrate 28. Device layers 30 typically include an n-type region grown first over the substrate. The n-type region may include multiple layers of different compositions and dopant concentration including, for example, preparation layers such as buffer layers or nucleation layers which may be n-type or not intentionally doped, release layers designed to facilitate later release of the growth substrate or thinning of the semiconductor structure after substrate removal, and n-type device layers designed for particular optical or electrical properties desirable for the light emitting region to efficiently emit light.

A light emitting region is grown over the n-type region. Examples of suitable light emitting regions include a single thick or thin light emitting layer and a multiple quantum well light emitting region including multiple thin or thick quantum well light emitting layers separated by barrier layers.

A p-type region is grown over the light emitting region. Like the n-type region, the p-type region may include multiple layers of different composition, thickness, and dopant concentration, including layers that are not intentionally doped, or n-type layers.

After growth of the semiconductor layers, the semiconductor structure is etched to expose one or more surfaces of the buried n-type region. Contacts 32 and 34 are then formed which electrically connect to the exposed n-type region and the remaining p-type region. In some embodiments, contacts 32 and 34 include a stack of metal and dielectric layers. Such a device is illustrated in more detail in FIGS. 5 and 6.

Figure 5:
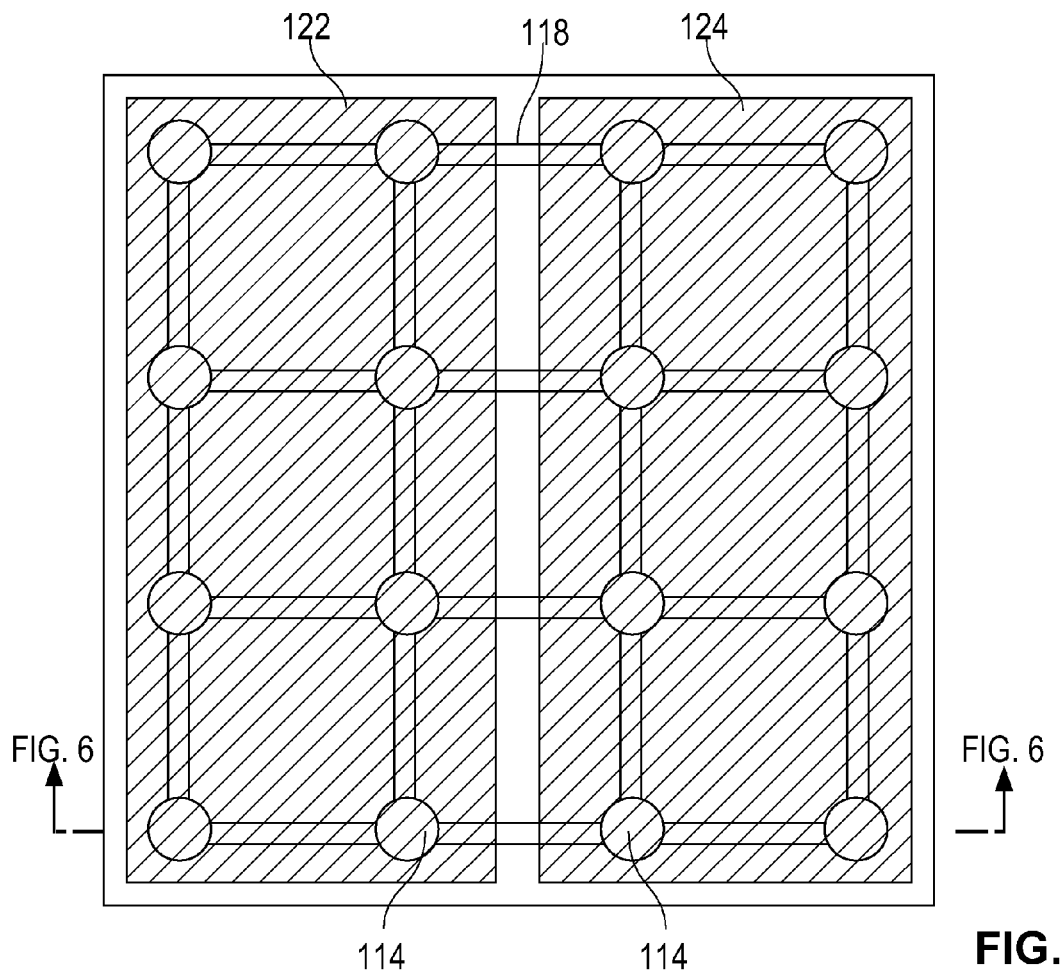
FIGS. 5 and 6 are a plan view and a cross sectional view of a III-nitride flip chip light emitting device.
Figure 6:
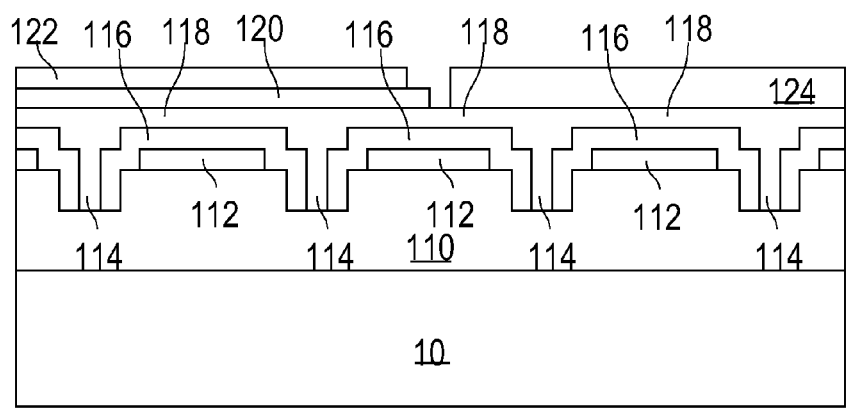

FIG. 5 is a plan view of a device including multiple small metal contacts formed in vias etched through the semiconductor structure to expose the n-type region. FIG. 6 is a cross section of the device shown in FIG. 5, taken along the axis shown. FIGS. 5 and 6 illustrate metal-dielectric stacks, which may be used to make arbitrary contact shapes. The device of FIGS. 5 and 6 is described in more detail in U.S. Pat. No. 6,828,586, which is incorporated herein by reference.

As described above, an epitaxial semiconductor structure 110 is grown on a growth substrate 10, which may or may not remain a part of the finished device. Multiple vias are formed in which n-type contacts 114 make electrical contact to the n-type region of semiconductor structure 110. P-type contacts 112 are formed on the remaining portions of the p-type region of semiconductor structure 110. The individual n-type contacts 114 formed in the vias are electrically connected by conductive regions 118. The device may be flipped relative to the orientation illustrated in FIGS. 5 and 6 and mounted on a mount contact-side down such that light is extracted from semiconductor structure 110 through the surface adjacent to substrate 10. N-type contacts 114 and conductive regions 118 make electrical contact to the mount by n-type connection region 124. Underneath n-type connection region 124, the p-type contacts 112 are isolated from n-type contacts 114, conductive regions 118, and n-type connection region 124 by dielectric 116. P-type contacts 112 make electrical contact to the mount by p-type connection region 122. Underneath p-type connection region 122, n-type contacts 114 and conductive regions 118 are isolated from p-type connection region 122 by dielectric 120.

Returning to FIG. 4, semiconductor structure 30 is electrically and physically connected to n-type lead 24 and p-type lead 22 by n-type interconnect 36 and p-type interconnect 38. For example, interconnects 36 and 38 may be gold, which may be plated on metal-dielectric stacks 32 and 34. Gold interconnects may be formed as large area interconnects, as shown in FIG. 4, or as multiple stud-bumps. Semiconductor structure 30 may be attached to the leads by, for example, thermosonic bonding. Alternatively, interconnects 36 and 38 may be conductive epoxy or solder, formed in large areas as shown in FIG. 4, or as multiple solder balls.

To form a thermosonic bond, one or more metal interconnects are formed on one or both of the semiconductor device and the mount. A bond head is positioned on the top surface of the semiconductor device, often the top surface of a sapphire growth substrate in the case of a III-nitride device grown on sapphire. The bond head is connected to an ultrasonic transducer, which may be, for example, a stack of lead zirconate titanate (PZT) layers. When a voltage is applied to the transducer at a frequency that causes the system to resonate harmonically (often a frequency on the order of tens or hundreds of kHz), the transducer begins to vibrate, which in turn causes the bond head and the semiconductor device to vibrate, often at an amplitude on the order of microns. The vibration causes atoms in the metal lattice of the interconnects to interdiffuse, resulting in a metallurgically uniform joint. This process may occur at a temperature between 150 and 200° C. Pressure may be applied to the top of the bond head, for example on the order of 100 N/mm$^2$ of interconnect area.

Figure 7:
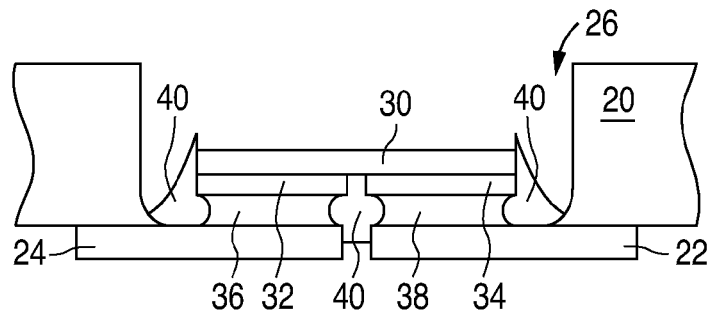
FIG. 7 is a cross sectional view of the structure of FIG. 4 after underfilling the device and removing the growth substrate.

After mounting, growth substrate 28 may be removed by a process suitable to the substrate material, such as etching or laser melting. A rigid underfill 40 may be provided between semiconductor structure 30, carrier 20, and leads 22 and 24, as illustrated in FIG. 7. Underfill 40 may be formed before or after mounting the device on leads 22 and 24. Underfill 40 supports semiconductor structure 30 to prevent or reduce cracking or other damage during substrate removal.

A portion of semiconductor structure 30 may be removed by thinning after removing the substrate. Light extraction features may be formed in the exposed surface of the n-type region. For example, the exposed surface of the n-type region may be roughened by an etching process such as photoelectrochemical etching or by a mechanical process such as grinding. Alternatively, a photonic crystal structure such as a periodic lattice of holes in the semiconductor structure may be formed in the top surface of the semiconductor structure by a high resolution lithography technique such as electron beam lithography, nano-imprint lithography, deep X-ray lithography, interferometric lithography, hot embossing, microcontact printing, surface conformal imprint lithography.

To form a photonic crystal structure by surface conformal imprint lithography, a material suitable for forming into a patterned mask, such as a silicon oxide compound dissolved in one or more solvents, is deposited on a surface of the semiconductor structure, for example by spincoating, dipcoating, jet printing, or printing. The material is partially dried. A stamp with the pattern to be imprinted, which corresponds to the photonic crystal structure, is pressed into the partially dried material. The stamp may be, for example, silicone rubber, formed such that the stamp is permeable to gas and/or liquid constituents of the deposited material. The stamp and semiconductor structure are pressed together, for example, at room temperature for a period of 30 minutes, during which time liquid constituents of the deposited material are absorbed by the stamp. When the deposited material is dry, the stamp is removed, leaving a pattern that serves as an etch mask for the photonic crystal structure. The photonic crystal structure is then etched by conventional etching techniques.

A structure such as a phosphor layer or secondary optics known in the art such as dichroics or polarizers may be applied to the emitting surface.

Figure 8:
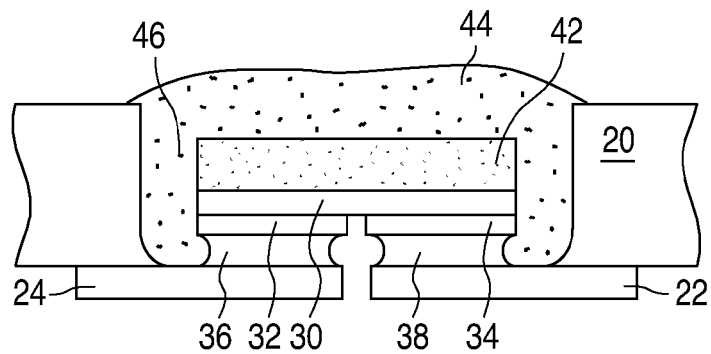
FIG. 8 is a cross sectional view of a structure including at least one wavelength converting layer and a light extracting material.

One or more wavelength converting layers may be disposed over semiconductor structure 30, as illustrated in FIG. 8. A wavelength converting layer may be configured such that all light emitted by semiconductor structure 30 is converted, for example for an application requiring monochromatic light of the color emitted by the wavelength converting layer. Alternatively, the one or more wavelength converting layers may be configured such that some light emitted by semiconductor structure 30 leaks through the wavelength converting layer, for example when a blue emitting semiconductor structure 30 is combined with a single yellow-emitting phosphor, or with multiple phosphors such as a yellow- or green-emitting phosphor and a red-emitting phosphor, such that the combined light exiting the structure appears white.

In the device illustrated in FIG. 8, a wavelength converting layer 42 is disposed over the emitting surface of semiconductor structure 30. Depending on the thickness of the wavelength converting layer and of the carrier, the top of wavelength converting layer may be taller than the top of carrier 20. Wavelength converting layer 42 may be a phosphor layer formed by, for example, stenciling or electrophoretic deposition. Alternatively, wavelength converting layer 42 may be a luminescent ceramic layer. Luminescent ceramics are made by heating a conventional powder phosphor under pressure until the surface of the phosphor particles begin to soften and melt. The partially melted particles stick together to form a rigid agglomerate of particles. Unlike a thin film, which optically behaves as a single, large phosphor particle with no optical discontinuities, a luminescent ceramic behaves as tightly packed individual phosphor particles, such that there are small optical discontinuities at the interface between different phosphor particles. The luminescent ceramic may be uniformly doped with dopants that act as light-emitting centers, or may include regions with light-emitting centers surrounded by undoped ceramic regions. A luminescent ceramic may be connected to semiconductor structure 30, for example, by a transparent adhesive layer such as silicone, epoxy, or sol gel, dielectrics such as $SiO_x$ or $SiN_x$, or by direct bonding.

A luminescent ceramic may be formed from any suitable phosphor. Suitable yellow/green emitting phosphors include aluminum garnet phosphors with the general formula $(Lu_{1-x-y-a-b}Y_xGd_y)_3(Al_{1-z}Ga_z)_5O_{12}:Ce_aPr_b$ wherein $0<x<1$, $0<y<1$, $0\leqq z<0.1$, $0<a\leqq 0.2$ and $0<b\leqq 0.1$, such as, for example, $Lu_3Al_5O_{12}:Ce^{3+}$ and $Y_3Al_5O_{12}:Ce^{3+}$; $(Sr_{1-a-b}Ca_b Ba_c)Si_xN_yO_z:Eu_a^{2+}$ wherein a=0.002-0.2, b=0.0-0.25, c=0.0-0.25, x=1.5-2.5, y=1.5-2.5, z=1.5-2.5 such as, for example, $SrSi_2N_2O_2:Eu^{2+}$; $(Sr_{1-u-v-x}Mg_uCa_vBa_x)(Ga_{2-y-z}Al_yIn_zS_4):Eu^{2+}$ such as, for example, $SrGa_2S_4:Eu^{2+}$; and $Sr_{1-x}Ba_xSiO_4:Eu^{2+}$. A suitable $Y_3Al_5O_{12}:Ce^{3+}$ ceramic may be produced as follows: 40 g $Y_2O_3$ (99.998%), 32 g $Al_2O_3$ (99.999%), and 3.44 g $CeO_2$ are milled with 1.5 kg high purity alumina balls (2 mm diameter) in isopropanol on a roller bench for 12 hrs. The dried precursor powder is then calcined at 1300° C. for two hours under CO atmosphere. The YAG powder obtained is then deagglomerated with a planet ball mill (agate balls) under ethanol. The ceramic slurry is then slip cast to obtain a ceramic green body after drying. The green bodies are then sintered between graphite plates at 1700° C. for two hours.

The luminescent ceramic can be textured or molded, ground, machined, hot stamped, or polished into shapes that are desirable, for example, for increased light extraction. For example, a luminescent ceramic may be shaped into a lens such as a dome lens or Fresnel lens, roughened, or textured with a photonic crystal structure, such as a periodic lattice of holes formed in the ceramic. The shaped ceramic layer may be smaller than, the same size as, or larger than the surface to which it is attached.

An optional transparent material 44 may be disposed over semiconductor structure 30. Though material 44 is described herein as "transparent," it is to be understood that material 44 need not be completely transparent, though in most embodiments it is preferable that material 44 not absorb a significant amount of light. In some embodiments, transparent material 44 is selected to be as close a match as possible in index of refraction to the index of refraction of semiconductor structure 30, in order to facilitate light extraction. Transparent material 44 may be, for example, silicone.

In some embodiments, one or more wavelength converting materials 46 such as phosphor is disposed in transparent material 44. Assuming a semiconductor structure that emits blue light, if wavelength converting material 42 is a green-emitting luminescent ceramic, wavelength converting material 46 may be a red-emitting phosphor. Alternatively, wavelength converting layer 42 may be omitted and wavelength converting material 46 may be a single yellow-emitting phosphor or a mixture of yellow- or green-emitting phosphor and red-emitting phosphor.

Figure 9:
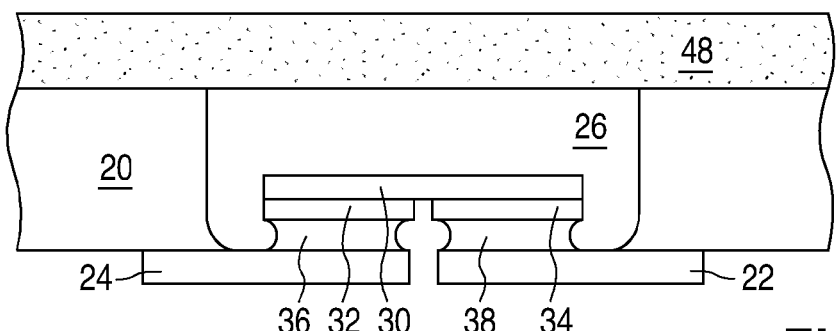
FIG. 9 is a cross sectional view of structure including a wavelength converting layer spaced apart from the semiconductor structure.

In the device illustrated in FIG. 9, a structure 48 such as a filter, lens, polarizer, or luminescent ceramic as described above, is disposed over semiconductor structure 30, spaced apart from the semiconductor structure. For example, as illustrated in FIG. 9, a luminescent ceramic is attached to the remaining portions of carrier 20 surrounding cavity 26. Structure 48 may be attached by an adhesive disposed between carrier 20 and structure 48. Alternatively, a transparent encapsulating material disposed in cavity 26, as described above, may act as an adhesive between structure 48 and semiconductor structure 30. A sheet of material 48 may be formed over a carrier including cavities 26 (such as illustrated in plan view in FIG. 3), then structure 48 may be diced with carrier 20 to form individual devices.

Figure 10:
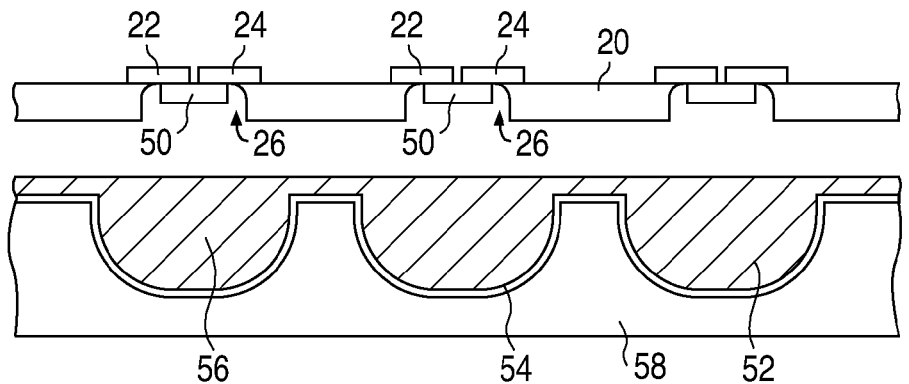
FIG. 10 illustrates a process for molding a lens over a device disposed in a cavity.
Figure 11:
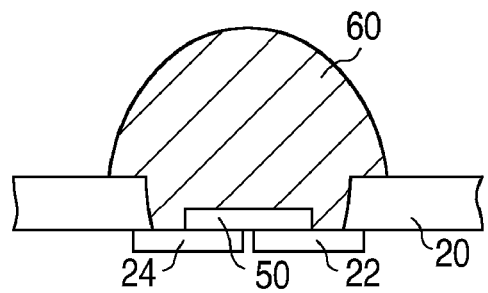
FIG. 11 is a cross sectional view of a structure after the overmolding process described in FIG. 10.

In some embodiments, a lens or other optical element may be molded over a device disposed in a cavity in a carrier, as illustrated in FIGS. 10 and 11. FIG. 10 is a side view of three LED dice 50 mounted in cavities 26 formed in a carrier 20, as described above.

A mold 58 with indentations 52 corresponding to the desired shape of a lens over each die 50 is aligned with the dice in the carrier. Mold 58 is generally metal. An optional thin non-stick film 54, having the general shape of mold 58, may be placed over mold 58. Film 54 is a material that prevents the molding material from sticking to the metal mold.

The indentions 52 in mold 58 are filled with a heat-curable liquid lens material 56. Lens material 56 may be any suitable optically transparent material such as silicone or an epoxy. A silicone with a sufficiently high index of refraction (for example, at least 1.76) may be selected to improve the light extraction from a III-nitride or other device, in addition to acting as a lens. A vacuum seal may created between the periphery of the carrier and mold 58, then the two pieces are pressed against each other so that each die 50 is inserted into the liquid lens material 56. Lens material 56 is under compression. The structure may then be heated to a temperature and for a time suitable to harden lens material 56, for example at least 150° C. for at least 30 minutes. Silicon wafers are particularly suited for the overmolding process described above, since they can be made flat enough to form an excellent surface on which to bond the lens. After curing, the carrier is separated from mold 58. Film 54 releases hardened lenses 60 (FIG. 11) from mold 58. Film 54 is then removed.

FIG. 11 illustrates the resulting structure, a molded lens 60 over each die 50. In one embodiment, the molded lens is between 1 mm and 5 mm in diameter, though the lens may be any size. A carrier with multiple devices may be diced into individual devices or groups of devices. Lens 60 may improve the light extraction from device 50 and refract the light to create a desired emission pattern, in addition to encapsulating the die to protect the die from contaminants, adding mechanical strength, and protecting any wire bonds. Though domed lenses are shown in the above example, many other shapes are possible. The shape of the lens may be selected for a desired emission profile.

In some embodiments, one or more wavelength converting materials such as phosphors can be added to an overmolded lens such as the lens shown in FIG. 11. For example, one or more phosphors may be mixed into the lens material 56 shown in FIG. 10. Multiple overmolding processes may be used to form multiple phosphor layers with the same or different phosphors, or to form one or more phosphor layers alternating with one or more layers of transparent material without phosphor. For example, a layer of transparent material may be molded first over the light emitting device, then a layer of material including a phosphor may be molded over the transparent layer. In addition, a rigid lens or other structure may be attached to a molded lens. The molded lens may be made more or less flexible by appropriately selecting the material.

Techniques besides overmolding may be used to form lenses over the devices illustrated and described above. For example, a sheet of premade lenses may be bonded or glued to a carrier with multiple cavities and devices.

In some embodiments of the device, known circuitry such as voltage protection circuitry or drive circuitry may be incorporated in carrier 20, adjacent to cavity 26. For example, in a silicon carrier, circuitry may be formed using known integrated circuitry fabrication techniques. Forming circuitry in or on a silicon mount is described in more detail in U.S. Pat. No. 6,885,035, which is incorporated herein by reference.

Figure 12:
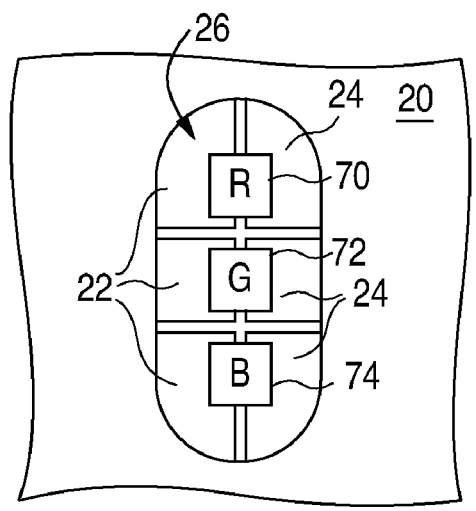
FIG. 12 is a plan view of multiple devices disposed in a single cavity.

FIG. 12 is a plan view of an array of chips disposed in a single cavity 26 in a carrier 20. Each of the chips in the array may emit the same color, or different colors. For example, one or more red-emitting devices 70, green-emitting devices 72, and blue-emitting devices 74 may be disposed in a single cavity. The leads may be patterned to form, for example series or parallel connections. The leads may also be patterned such that individual devices may be individually contacted, and therefore independently activated.

Figure 13:
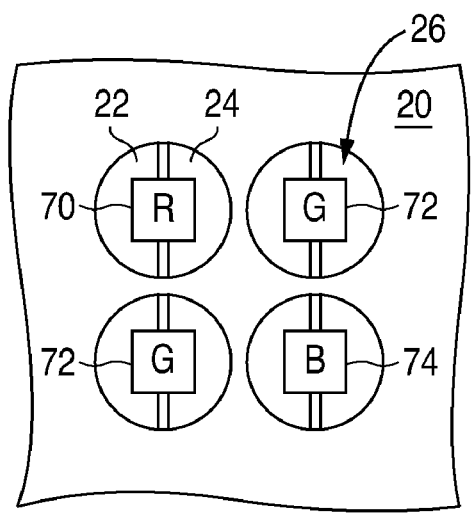
FIG. 13 is a plan view of an array of devices disposed in adjacent cavities.

FIG. 13 is a plan view of an array of chips disposed in adjacent cavities 26. As in the array illustrated in FIG. 12, devices emitting the same or different colors may be disposed in particular arrangements to create monochromatic or mixed light with a desired appearance. The size of the array is arbitrary and is determined when the carrier is diced.

The arrays illustrated in FIGS. 12 and 13 may be particularly useful for applications such as projection and lighting. If carrier 20 is transparent, it can be shaped to guide or spread light from the individual devices, or to mix light from adjacent devices. The individual devices may be selected such that the combined light has a desired color, which may be, for example, monochromatic or white light. The number and connection scheme of the devices in an array may be selected to achieve a particular voltage drop, such as for high voltage or alternating current applications.

The devices described herein offer several advantages. Silicon wafers in particular are inexpensive, flat, and easy to handle. The shape, size, and spacing of the cavities in each carrier may be easily changed by changing a mask. The finished device is thin and has excellent heat conduction properties.

The devices described herein are particularly useful as light sources for backlights for liquid crystal display panels, for example for cellular phones, personal digital assistants, laptop computers, and flat panel displays such as monitors and televisions.

FIG. 14 is a cross sectional view of a portion of a color, transmissive liquid crystal display (LCD) according to an embodiment of the invention. The display includes at least one semiconductor light emitting device 50 that emits white light disposed in a cavity 26 of a carrier 20. The number of devices 50 used depends on the size of the display and the required brightness. For example, a display on a cellular phone may require only a single LED, while a monitor may require 10. Carrier 20 may be made from a light guiding material and formed to provide homogenous white light to the back surface of the LCD.

The display includes two sheets of glass separated by liquid crystal layer 84. The glass sheet closest to carrier 20 includes a polarizing filter 80 and thin film transistor (TFT) array 82. Polarizing filter 80 linearly polarizes the white light. The polarized white light is then transmitted to a TFT array 82 having one transistor for each pixel. TFT arrays are well known. Above TFT array 82 is a liquid crystal layer 84; above liquid crystal layer 84 is a transparent conductive layer connected to ground. The absence of an electrical field across a pixel area of the liquid crystal layer 84 causes light passing through that pixel area to have its polarization rotated orthogonal to the incoming polarization. An electrical field across a pixel area of the liquid crystal layer 84 causes the liquid crystals to align and not affect the polarity of light. Selectively energizing the transistors controls the localized electrical fields across the liquid crystal layer 84. Both normally open (white) and normally closed (black) shutters are used in different displays.

The glass sheet furthest from carrier 20 includes an RGB filter 86 and a polarizing filter 88. Light output from the TFT array 82 is filtered by RGB pixel filter 86. The RGB pixel filter 86 may be comprised of a red filter layer, a green filter layer, and a blue filter layer. The layers may be deposited as thin films. As an example, the red filter layer contains an array of red light filter areas coinciding with the red pixel areas of the display. The remaining portions of the red filter are clear to allow other light to pass. Accordingly, the RGB pixel filter 86 provides a filter for each R, G, and B pixel in the display. The filters used in RGB pixel filter 86 depend on the wavelengths used in the light source.

A polarizing filter 88 only passes polarized light orthogonal to the light output from the polarizing filter 80. Therefore, the polarizing filter 88 only passes light that has been polarized by a non-energized pixel area in the liquid crystal layer 84 and absorbs light that passes through the energized portions of the liquid crystal layer 84. The magnitudes of the electric fields across the liquid crystal layer 84 controls the brightness of the individual R, G, and B components to create any color. In this manner, any color image may be presented to the viewer by selectively energizing the various transistors in the TFT array 82.

Having described the invention in detail, those skilled in the art will appreciate that, given the present disclosure, modifications may be made to the invention without departing from the spirit of the inventive concept described herein. For example, though the above examples describe flip chip devices, it is to be understood that vertical devices, where the contacts are formed on opposite sides of the semiconductor structure, may be used. In such devices, a wire bond may electrically connect the top contact to a lead or other structure. Also, it is to be understood that the different features of the embodiments described herein may be combined or used separately. Further, though the examples above refer to III-nitride light emitting diodes emitting blue or UV light, embodiments of the invention may include other device structures or devices fabricated from other materials. Therefore, it is not intended that the scope of the invention be limited to the specific embodiments illustrated and described.

What is claimed is:

1. A structure comprising:
   a mount, the mount comprising:
      a carrier;
      at least two metal leads disposed on a bottom surface of the carrier; and
      a cavity extending through a thickness of the carrier to expose a portion of top surfaces of the at least two metal leads;
   a semiconductor light emitting device disposed in the cavity, the semiconductor light emitting device comprising a light emitting layer disposed between an n-type region and a p-type region; and
   a wavelength converting material disposed over the semiconductor light emitting device.

2. The structure of claim 1 wherein the carrier comprises one of silicon, GaAs, GaP, Ge, plastic, alumina, ceramic, fluoropolymer, polycrystalline materials, and glass.

3. The structure of claim 1 wherein the carrier is flexible.

4. The structure of claim 1 further comprising a luminescent material disposed within the carrier.

5. The structure of claim 1 wherein the at least two metal leads comprise a layer of gold that forms the top surface and a layer of copper disposed beneath the layer of gold.

6. The structure of claim 1 wherein the wavelength converting material is a phosphor mixed with a transparent material disposed in the cavity.

7. The structure of claim 1 wherein the wavelength converting material is a luminescent ceramic disposed over the semiconductor light emitting device.

8. The structure of claim 1 wherein the wavelength converting material is a luminescent ceramic disposed over a top opening to the cavity.

9. The structure of claim 1 further comprising a reflector disposed over the semiconductor light emitting device.

10. The structure of claim 1 further comprising light extraction features formed in a top surface of the semiconductor light emitting device.

11. The structure of claim 1 wherein the mount further comprises a reflective material disposed on at least a portion of sidewalls of the cavity.

12. The structure of claim 1 further comprising contacts electrically connected to the n-type region and p-type region of the semiconductor light emitting device, wherein the contacts are formed on a same side of the semiconductor light emitting device and the device is positioned in the cavity as a flip chip.

13. The structure of claim 1 further comprising an underfill disposed between the at least two metal leads and the semiconductor light emitting device.

14. The structure of claim 1 further comprising a lens disposed over the cavity.

15. The structure of claim 14 wherein the lens is silicone.

16. The structure of claim 1 wherein the semiconductor light emitting device is a first light emitting device, the structure further comprising a second semiconductor light emitting device.

17. The structure of claim 16 wherein the second semiconductor light emitting device is disposed in the cavity.

18. The structure of claim 16 wherein:
   the cavity is a first cavity;
   the mount further comprises a second cavity extending through the thickness of the carrier to expose a portion of top surfaces of at least two metal leads; and
   the second semiconductor light emitting device is disposed in the second cavity.

19. The structure of claim 16 wherein the first and second semiconductor light emitting devices emit light of different colors.

20. The structure of claim 16 wherein the first and second semiconductor light emitting devices emit light of a same color.

21. The structure of claim 16 further comprising a third semiconductor light emitting device, wherein a combination of light emitted from the first device, light emitted from the second device, and light emitted from the third device appears white.

22. The structure of claim 16 wherein the first and second semiconductor light emitting devices are connected to the mount such that the first light emitting device may be activated without activating the second semiconductor light emitting device.

23. The structure of claim 1 further comprising an insulating material disposed between portions of the carrier and portions of the at least two metal leads.

24. The structure of claim 23 wherein the insulating material comprises an oxide of silicon.

25. The structure of claim 1 further comprising a liquid crystal layer disposed over the mount.

26. A method comprising:
   providing a carrier having metal leads formed on a bottom surface of the carrier;

forming a cavity in the carrier, wherein the cavity extends from a top surface of the carrier through a thickness of the carrier to expose tops of the metal leads;

disposing a semiconductor light emitting device comprising a light emitting layer disposed between an n-type region and a p-type region within in the cavity, wherein the semiconductor light emitting device is connected to the metal leads; and disposing a wavelength converting material over the semiconductor light emitting device.

27. The method of claim 25 wherein forming a the cavity comprises one of etching, laser machining, and ablating.

* * * * *